(12) United States Patent
Do et al.

(10) Patent No.: US 11,468,221 B2
(45) Date of Patent: Oct. 11, 2022

(54) METHODS FOR VFET CELL PLACEMENT AND CELL ARCHITECTURE

(71) Applicant: SAMSUNG ELECTRONICS CO., LTD., Suwon-si (KR)

(72) Inventors: Jung Ho Do, Hwaseong-si (KR); Seung Hyun Song, Hwaseong-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 121 days.

(21) Appl. No.: 16/741,209

(22) Filed: Jan. 13, 2020

(65) Prior Publication Data

US 2020/0356717 A1 Nov. 12, 2020

Related U.S. Application Data

(60) Provisional application No. 62/846,157, filed on May 10, 2019.

(51) Int. Cl.
*G06F 30/392* (2020.01)
*H01L 27/02* (2006.01)
(Continued)

(52) U.S. Cl.
CPC ........ *G06F 30/392* (2020.01); *H01L 23/5286* (2013.01); *H01L 27/0207* (2013.01);
(Continued)

(58) Field of Classification Search
CPC ... G06F 30/392; G06F 30/39; H01L 27/0207; H01L 23/5286; H01L 29/7827;
(Continued)

(56) References Cited

U.S. PATENT DOCUMENTS 6,156,611 A * 12/2000 Lan .................... H01L 29/66522
257/E21.441
7,525,844 B2 * 4/2009 Edahiro .................... G11C 7/06
365/185.21
(Continued)

*Primary Examiner* — Marcos D. Pizarro
(74) *Attorney, Agent, or Firm* — Sughrue Mion, PLLC

(57) ABSTRACT

A cell architecture and a method for placing a plurality of cells to form the cell architecture are provided. The cell architecture includes at least a $1^{st}$ cell and a $2^{nd}$ cell placed next to each other in a cell width direction, wherein the $1^{st}$ cell includes a one-fin connector which is formed around a fin among a plurality of fins of the $1^{st}$ cell, and connects a vertical field-effect transistor (VFET) of the $1^{st}$ cell to a power rail of the $1^{st}$ cell, wherein a $2^{nd}$ cell includes a connector connected to a power rail of the $2^{nd}$ cell, wherein the fin of the $1^{st}$ cell and the connector of the $2^{nd}$ cell are placed next to each other in the cell width direction in the cell architecture, and wherein the one-fin connector of the $1^{st}$ cell and the connector of the $2^{nd}$ cell are merged.

14 Claims, 18 Drawing Sheets

(51) Int. Cl.

| | |
|---|---|
| *H01L 23/528* | (2006.01) |
| *H01L 29/78* | (2006.01) |
| *H01L 27/092* | (2006.01) |
| *H01L 27/11524* | (2017.01) |
| *H01L 27/11565* | (2017.01) |
| *H01L 27/1157* | (2017.01) |
| *H01L 27/11582* | (2017.01) |
| *H01L 29/08* | (2006.01) |
| *H01L 29/417* | (2006.01) |
| *H01L 29/66* | (2006.01) |
| *H01L 27/11556* | (2017.01) |

(52) U.S. Cl.
CPC ........ *H01L 27/092* (2013.01); *H01L 27/1157* (2013.01); *H01L 27/11524* (2013.01); *H01L 27/11556* (2013.01); *H01L 27/11565* (2013.01); *H01L 27/11582* (2013.01); *H01L 29/0847* (2013.01); *H01L 29/41741* (2013.01); *H01L 29/66795* (2013.01); *H01L 29/785* (2013.01); *H01L 29/7827* (2013.01)

(58) Field of Classification Search
CPC ............. H01L 27/092; H01L 27/11556; H01L 27/11582; H01L 21/823885; H01L 21/823871; H01L 27/11519; H01L 27/11524; H01L 27/11565; H01L 27/1157; H01L 23/528; H01L 29/41741; H01L 29/0847; H01L 27/105; H01L 29/6681; H01L 29/66795; H01L 29/785
See application file for complete search history.

(56) References Cited

U.S. PATENT DOCUMENTS

| | | |
|---|---|---|
| 8,174,868 B2 | 5/2012 | Liaw |
| 8,981,493 B2 | 3/2015 | Cheng et al. |
| 9,761,712 B1 | 9/2017 | Anderson et al. |
| 9,825,032 B1 | 11/2017 | Bentley et al. |
| 10,074,570 B2 | 9/2018 | Anderson et al. |
| 10,170,595 B2 | 1/2019 | Cheng et al. |
| 2007/0245281 A1 | 10/2007 | Riepe et al. |
| 2014/0315363 A1* | 10/2014 | Balakrishnan ...... H01L 27/1108 438/233 |
| 2017/0061057 A1 | 3/2017 | Lee |

* cited by examiner

METHODS FOR VFET CELL PLACEMENT AND CELL ARCHITECTURE

CROSS-REFERENCE TO THE RELATED APPLICATION

This application claims priority from U.S. Provisional Application No. 62/846,157 filed on May 10, 2019 in the U.S. Patent and Trademark Office, the disclosure of which is incorporated herein in its entirety by reference.

BACKGROUND

1. Field

Apparatuses and methods consistent with embodiments of the inventive concept relate to semiconductor cell architectures for vertical field effect transistors (VFETs).

2. Description of the Related Art

One of the advantages that the VFET has over a planar or horizontal fin FET is that the VFET can enable to easily form a one-fin semiconductor cell to achieve a higher-density semiconductor cell having at least a smaller cell width.

The one-fin semiconductor cell refers to a semiconductor cell in which a connector or a connection structure (hereafter "connector") is formed around one fin or fin structure (hereafter "fin"), not at least two fins or fin structures, connecting the VFET to a power rail of the one-fin semiconductor cell to provide a power voltage (Vdd) or a ground voltage (Vss) to the VFET. The connector formed around the one fin, referred to as one-fin connector, can be implemented by a bottom source/drain (S/D) region of the VFET formed around the one fin, which is referred to as a one-fin bottom S/D region. Hereafter, a VFET semiconductor cell is referred to as a cell, and a one-fin semiconductor cell, an at least one-fin semiconductor cell, and an at least two-fin semiconductor cell are referred to as a one-fin cell, an at least one-fin cell, and an at least two-fin cell, respectively, for brevity.

Since a one-fin connector such as a one-fin bottom S/D region is formed around one fin in a cell, the width thereof in a cell width direction is smaller than an at least two-fin connector such as an at least two-fin bottom S/D region formed around at least two fins in a cell, respectively. Accordingly, a one-fin cell including the one-fin connector has advantages in reducing a cell width compared to an at least two-fin cell including an at least two-fin connector in designing and manufacturing a cell architecture including a plurality of cells. Herein, a bottom S/D region being formed around a fin may refer to a bottom S/D region being structured to contact or encompass a lower part of the fin.

Despite the advantages in the smaller cell width, achieving a one-fin cell is difficult due to complexity in patterning a one-fin connection structure such as a one-fin bottom S/D region connected to a power rail of the one-fin cell. Further, because of cell design rules controlling sizes of a back-end-of-line (BEOL) elements such as a metal contact line, and a middle-of-the-line (MOL) elements such as a power contact structure, design and manufacture of a cell architecture including a one-fin cell is very complicated and restricted.

Thus, in designing and placing cells in a cell layout to form a cell architecture, it is necessary to avoid disposing or placing a one-fin connection structure such as a one-fin bottom S/D region connected to a power rail of a corresponding cell.

SUMMARY

Various embodiments of the inventive concept are directed to cell layouts, cell architectures, and methods for placing a plurality of cells in a cell layout to form a cell architecture including a plurality of VFETs.

These embodiments may provide improved cell architectures which have a reduced cell width, and methods to achieve the improved cell architectures.

According to embodiments, there is provided a cell architecture including at least a $1^{st}$ cell and a $2^{nd}$ cell placed next to each other in a cell width direction, wherein the $1^{st}$ cell may include a one-fin connector which is formed around a fin among a plurality of fins of the $1^{st}$ cell, and connects a VFET of the $1^{st}$ cell to a power rail of the $1^{st}$ cell, and a $2^{nd}$ cell may include a connector connected to a power rail of the $2^{nd}$ cell. Here, the fin of the $1^{st}$ cell and the at least one fin of the $2^{nd}$ cell may be placed next to each other in the cell width direction in the cell architecture, and the one-fin connector of the $1^{st}$ cell and the at least one-fin connector of the $2^{nd}$ cell are merged.

According to embodiments, the connector of the $2^{nd}$ cell may include an at least one-fin connector which is formed around at least one fin of the $2^{nd}$ cell, and connects at least one VFET of the $2^{nd}$ cell to the power rail of the $2^{nd}$ cell.

According to embodiments, the one-fin connector of the $1^{st}$ cell may include a one-fin bottom S/D region of the VFET of the $1^{st}$ cell, and the at least one-fin connector of the $2^{nd}$ cell may include an at least one-fin bottom S/D region of the at least one VFET of the $2^{nd}$ cell.

According to embodiments, the one-fin connector of the $1^{st}$ cell may include a one-fin top source/drain (S/D) contact structure formed on a top S/D region of the VFET of the $1^{st}$ cell, and the at least one-fin connector of the $2^{nd}$ cell comprises an at least one-fin top S/D contact structure formed on at least one top S/D region of the at least one VFET of the $2^{nd}$ cell According to embodiments, there is provided a cell architecture including a $1^{st}$ cell and a $2^{nd}$ cell placed next to each other in a cell width direction, wherein a $1^{st}$ cell may include an at least two-fin connector which is formed around at least two fins of the $1^{st}$ cell, and connects at least one VFET of the $1^{st}$ cell to a power rail of the $1^{st}$ cell, and the $2^{nd}$ cell may include an at least one-fin connector formed around at least one fin of the $2^{nd}$ cell to connect at least one VFET of the $2^{nd}$ cell for internal signal routing without being connected to a power rail of the $2^{nd}$ cell. Here, the at least two fins of the $1^{st}$ cell and the at least one fin of the $2^{nd}$ cell are placed next to each other in the cell width direction in the cell architecture.

According to embodiments, there is provided a method for cell placement in a cell layout to form a cell architecture comprising a plurality of vertical field-effect transistors (VFETs). The method may include: placing, in the cell layout, a $1^{st}$ cell including a one-fin connector which connects a VFET to a power rail of the $1^{st}$ cell, and is formed around one fin of the $1^{st}$ cell; determining characteristics of a $2^{nd}$ cell to be placed next to the $1^{st}$ cell with respect to an at least one-fin connector which connects at least one VFET to a power rail of the $2^{nd}$ cell, and is formed around at least one fin of the $2^{nd}$ cell; and based on a result of the determining, performing: a first operation in which the $2^{nd}$ cell is placed next to the $1^{st}$ cell in the cell layout, and the one-fin connector of the $1^{st}$ cell is merged with the at least one-fin connector of the $2^{nd}$ cell; a second operation in which the $1^{st}$ cell is replaced with a $3^{rd}$ cell which is configured to perform a same logic function or operation of the $1^{st}$ cell, and includes an at least two-fin connector connecting at least one VFET of the 3$^{rd}$ cell to a power rail of the 3$^{rd}$ cell and formed around at least two fins of the 3$^{rd}$ cell; or a third operation in which a fill cell is placed next to the 1$^{st}$ cell, and a connector connected to a power rail of the fill cell is merged with the one-fin connector of the 1$^{st}$ cell.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION

Figure 1A:
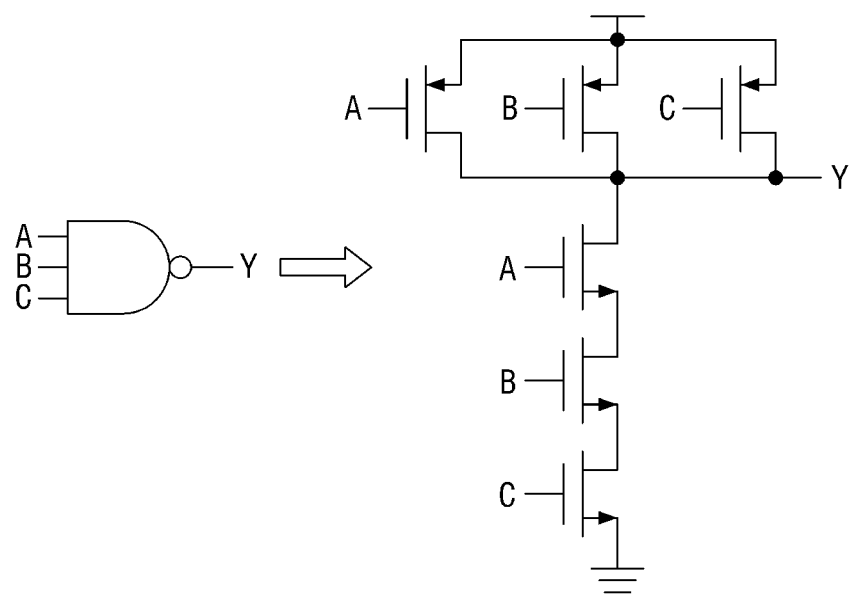
FIG. 1A illustrates a symbol and a schematic of a NAND3 circuit.

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, and some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A illustrates a symbol and a schematic of a NAND3 circuit having three gate input terminals A, B and C, and an output terminal Y. The NAND3 circuit can be implemented by cells shown in FIGS. 1B to 1D which illustrate top plan views of a two-fin cell, an equivalent two-fin cell, and an equivalent one-fin cell for implementing the same NAND3 circuit, according to embodiments. Each cell illustrated in FIGS. 1B to 1D is referred to as a NAND3 cell hereafter.

Figure 1B:
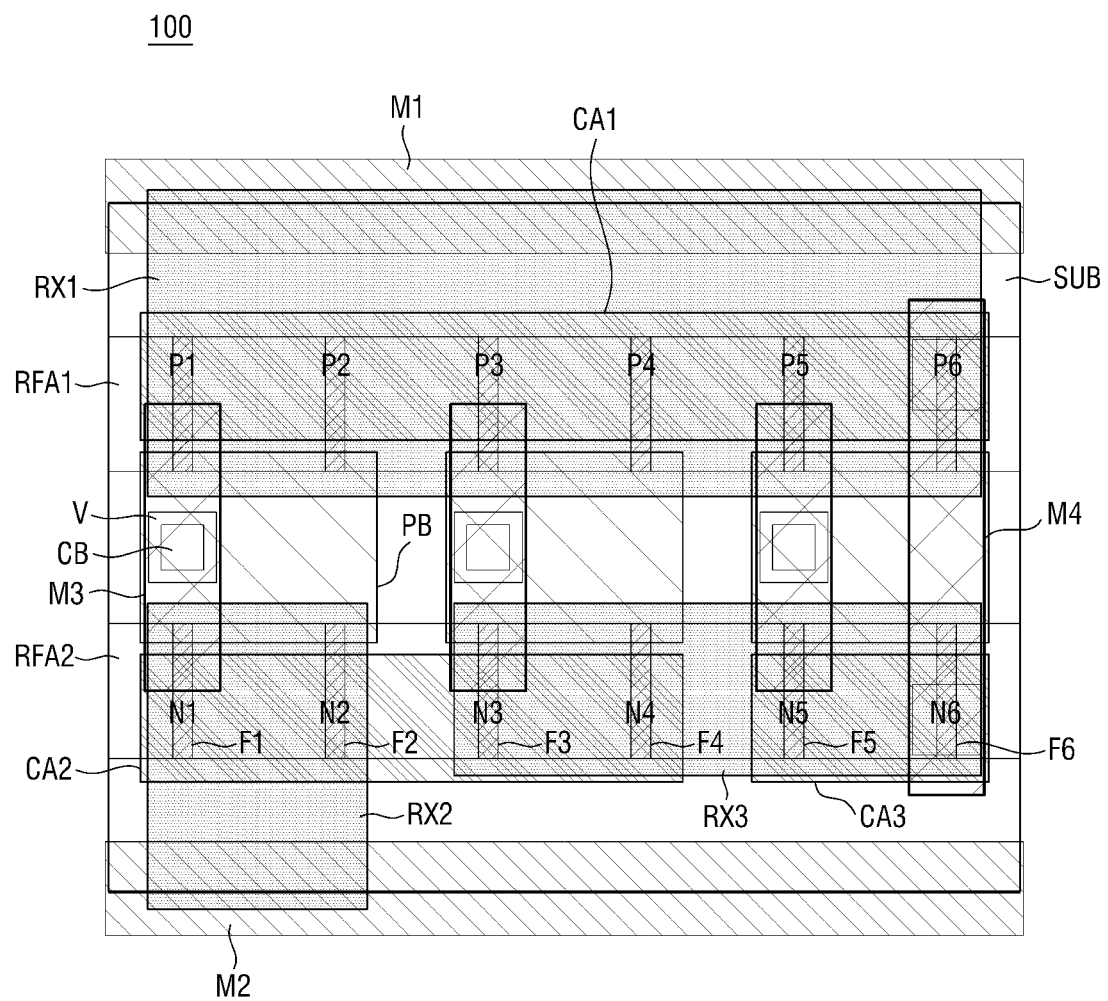
FIGS. 1B to 1D illustrate top plan views of cell layouts respectively including a two-fin cell, an equivalent two-fin cell, and an equivalent one-fin cell for implementing a NAND3 circuit, according to embodiments.
Figure 1C:
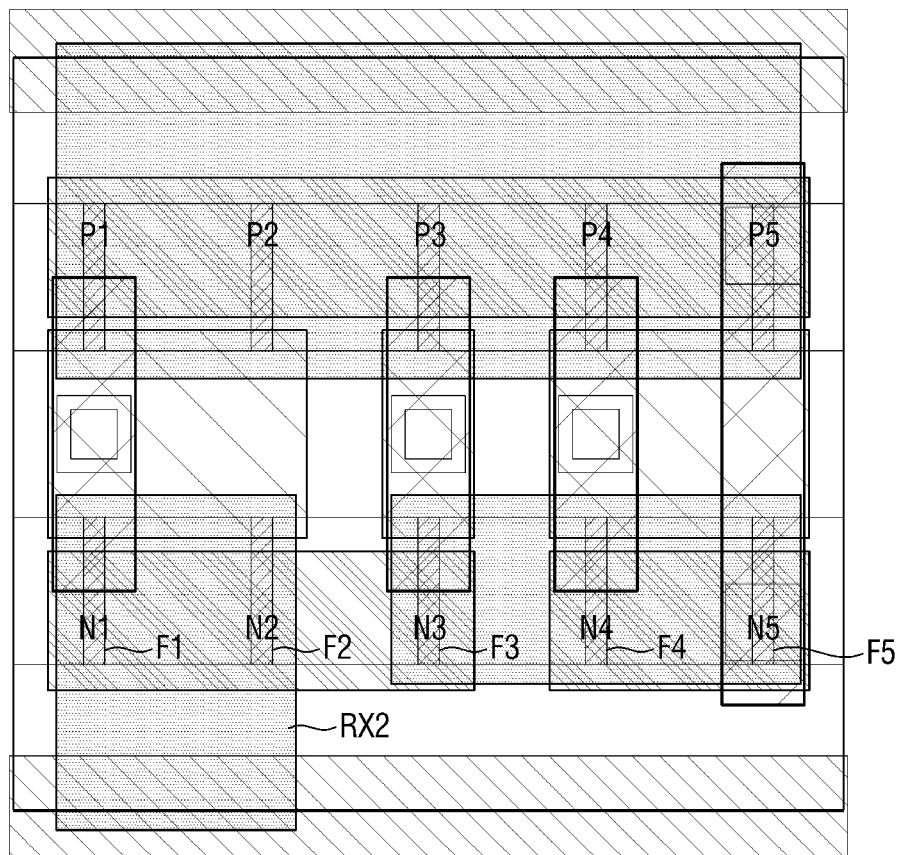
Figure 1D:
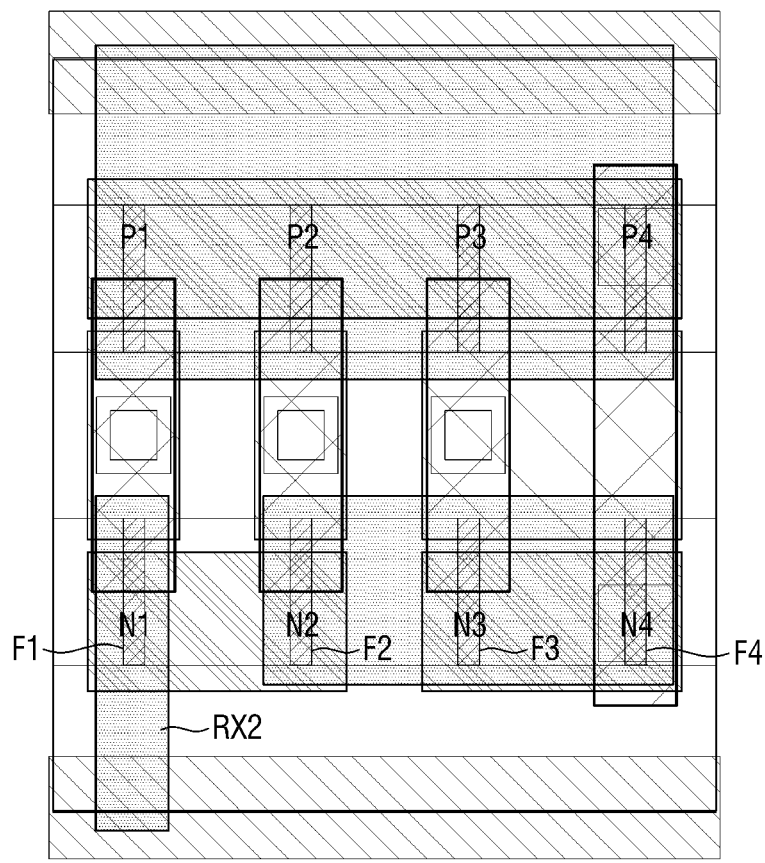

Referring to FIG. 1B, a NAND3 cell 100, which is a two-fin cell, includes six p-channel metal-oxide semiconductor (PMOS) VFETs (hereafter "PMOSs") P1 to P6 and six n-channel metal-oxide semiconductor NMOS VFETs (hereafter "NMOSs") N1 to N6 formed around six fins F1 to F6, respectively. Each of the fins F1 and F6 is included in two real fin areas RFA1 and RFA2 formed on a substrate SUB. Thus, in reality, the PMOSs P1 to P6 are formed around the fins F1 to F6 included in the real fin area RFA1, respectively, and the NMOSs N1 to N6 are formed around the fins F1 to F6 included in the real fin area RFA2, respectively. The PMOSs P1 to P6 are connected to a power rail M1 providing a positive voltage Vdd to the NAND3 cell 100 through a multi-fin bottom S/D region RX1 formed around the fins F1 to F6 in the real fin area RFA1. The NMOSs N1 and N2, among the NMOSs N1 to N6, are connected to a power rail M2 providing a ground voltage Vss to the NAND3 cell 100 through a multi-fin bottoms S/D region RX2 formed around the fins F1 and F2 in the real fin area RFA2. Here, it is noted herein that a bottom S/D region such as the multi-fin bottom S/D region RX2 or a one-fin bottom S/D region may connected to a power rail through a power contact structure formed below the power rail.

The power rail M1 and the power rail M2 may be formed of a metal, a metal compound, or its equivalent. The NAND3 cell 100 also includes three gate connection patterns PB each of which connects two gate structures of two neighboring PMOSs such as the PMOSs P1 and P2, and two gate structures of two neighboring NMOSs N1 and N2. On each of the gate connection patterns PB, a gate contact structure CB is formed to connect the four gates to a metal pattern M3 through a via V formed thereon. Each of the metal patterns M3 is provided to receive a gate input signal A, B or C of the NAND3 circuit, as shown in FIG. 1A. Above the fin F6, a metal pattern M4 is formed to output an output signal Y of the NAND3 circuit, as shown in FIG. 1A.

Each of the PMOSs P1 to P6 and the NMOSs N1 to N6 includes a top S/D region (not shown) and a bottom S/D region (not shown) to form a VFET with a gate structure. The bottom S/D regions of the NMOSs N3 to N6 are connected to form a four-fin bottom S/D region RX3 connecting the four NMOSs N3 to N6 to one another for internal signal routing without being connected to the power rail M2.

The NAND3 cell 100 also includes a six-fin top S/D contact structure CA1 formed by connecting the top S/D regions of the PMOSs P1 to P6, a four-fin top S/D contact structure CA2 formed by connecting the top S/D regions of the NMOSs N1 to N4, and a two-fin top S/D contact structure CA3 formed by connecting the top S/D regions of the NMOS N5 and N6.

In order to manufacture the NAND3 cell 100, each of the bottom S/D regions of the PMOSs P1 to P6 and the NMOSs N1 to N2 does not need to be independently and separately formed for power or ground connection, and instead, the multi-fin bottom S/D regions RX1 and RX2 having a sufficient width can be designed for easy patterning during a manufacturing process of the NAND cell 100.

Referring to FIG. 1C, a NAND cell 200 includes five PMOS VFETs (hereafter "PMOSs") P1 to P5 and five NMOS VFETs (hereafter "NMOSs") N1 to N5 formed around five fins F1 to F5, respectively. Since the VFETs forming the NAND3 cell 200 have structures which are the same or substantially the same as the structures of the VFETs forming the NAND3 cell 100 in FIG. 1B, redundant descriptions are omitted herein. Thus, like the two-fin bottom S/D region RX2 of the NAND cell 100 of FIG. 1B, the NAND cell 200 of FIG. 1C also has a two-fin bottom S/D region RX2, for power rail connection, having a sufficient width for easy patterning during a manufacturing process of the NAND cell 200. A difference between the NAND3 cell 200 and the NAND3 cell 100 is that the NAND3 cell 200 is configured to receive a gate input signal B input to only one PMOS P3 and one NMOS N3 while the NAND3 cell 100 is configured to receive the same gate input signal B input to two PMOSs P3 and P4 and two NMOSs N3 and N4.

Referring to FIG. 1D, a NAND cell 300, which is a one-fin cell, includes four PMOSs P1 to P4 and four NMOSs N1 to N4 formed around four fins F1 to F4, respectively. Since the VFETs forming the NAND3 cell 300 have structures which are the same or substantially the same as the structures of the VFETs forming the NAND3 cell 100 in FIG. 1B, redundant descriptions are also omitted herein. A difference between the NAND3 cell 300 and the NAND3 cell 100 is that the NAND3 cell 300 is configured to receive a gate input signal A input to only one PMOS P1 and one NMOS N1, and a gate input signal B input to only one PMOS P2 and one NMOS N2, while the NAND3 cell 100 is configured to receive the same gate input signal A input to two PMOSs P1 and P2 two NMOSs N1 and N2, and receive the same gate input signal B input to two PMOSs P3 and P4 and two NMOSs N3 an N4. Further, the NAND3 cell 300 is different from the NAND3 cells 100 and 200 in that the NAND3 cell has a one-fin bottom S/D region RX2, for power rail connection, formed around one-fin F1 on which the NMOS1 is formed, and thus, the one-fin bottom S/D region RX2 has a narrower width than the two-fin bottom S/D region RX2 of the NAND3 cells 100 and 200. As described above, the one-fin bottom S/D region RX2 forming the one-fin cell is very difficult to pattern during a design and manufacturing process despite the advantages of the one-fin cell described above.

Thus, in forming a cell architecture including one-fin cells, it is necessary to avoid a one-fin bottom S/D region of a VFET connected to a power rail of a corresponding one-fin cell.

Figure 2:
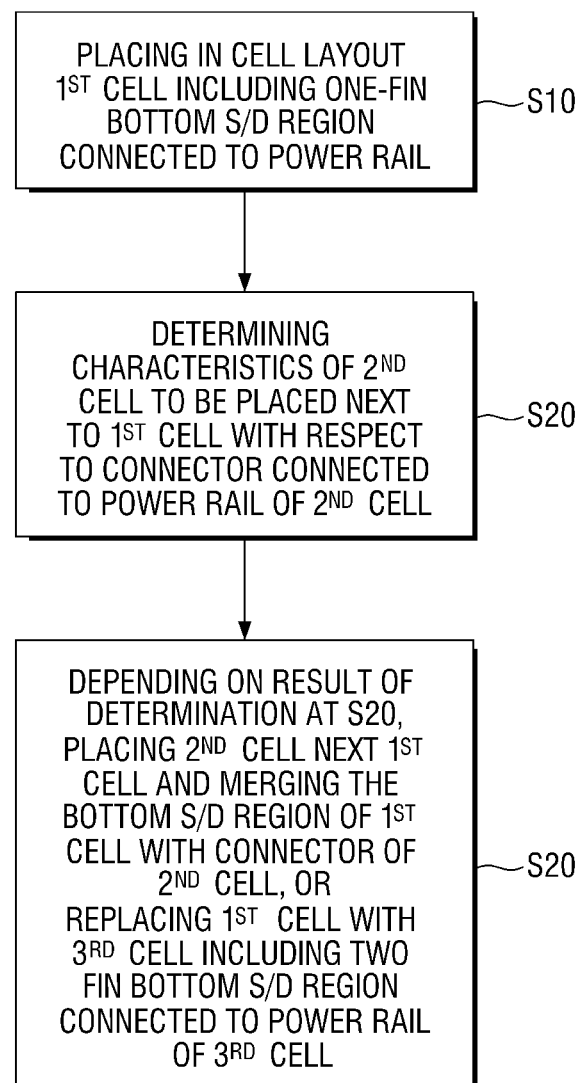
FIG. 2 illustrates a flowchart describing a method for placing a plurality of cells in a cell layout to form a cell architecture, according to an embodiment.

FIG. 2 illustrates a flowchart describing a method or algorithm (collectively "method" herein) for placing a plurality of cells in a cell layout to form or constitute a cell architecture, according to an embodiment. The method described in reference to FIG. 2 is provided for cell placement in a cell layout to form a cell architecture including at least one NAND3 cell corresponding to the schematic shown in FIG. 1A. However, the inventive concept is not limited to the present embodiment, and instead, may apply to a cell architecture including different cells having different logic circuits configured to perform different logic functions or operations.

The cell layouts and the cell architectures mentioned in the embodiments described herein may be provided in a form of graphic display on a computer screen by executing computer instruction codes to implement the methods according to the embodiments. The cell architecture may be designed and manufactured to perform one or more predetermined logic functions using the plurality of cells included in the cell architecture. Hereafter, when an element or component such as a fin of a cell is described as being placed next to another element or component such as another fin of the cell or another cell to form a cell architecture, it represents that the two elements or components are placed next to each other to abut each other in a cell width direction to form a cell architecture.

Referring to FIG. 2, a $1^{st}$ cell, which is a one-fin NAND3 cell including four PMOSs and four NMOSs, is provided and placed in a cell layout used to form a desired cell architecture (S10). Here, the $1^{st}$ cell for the present embodiment may have the same structure as that of the NAND3 cell 300 shown in FIG. 1D. Thus, like the one-fin bottom S/D region RX2 of the NAND3 cell 300, the $1^{st}$ cell includes a one-fin bottom S/D region as a one-fin connector connecting a corresponding NMOS (i.e., NMOS N1 in FIG. 1D) to a power rail in the $1^{st}$ cell, and this one-fin bottom S/D region has a narrow width. Further, the one-fin bottom S/D region of the NMOS in the $1^{st}$ cell is formed around one fin among a plurality of fins included in the $1^{st}$ cell. The other components or elements forming the $1^{st}$ cell may also have the same structures as those forming the NAND3 cell 300, and thus, redundant descriptions thereabout are omitted herebelow.

Next, characteristics of a $2^{nd}$ cell to be placed next to the $1^{st}$ cell in the cell layout to form or constitute the cell architecture are considered and determined at least with respect to a connector of the $2^{nd}$ cell connected to a power rail in the $2^{nd}$ cell (S20). This connector may be a bottom S/D region of at least one VFET included in the $2^{nd}$ cell when the $2^{nd}$ cell is a VFET cell, as described later. The characteristics of the $2^{nd}$ cell may include a location of at least one fin around which the connector of the $2^{nd}$ cell is formed.

Depending on a result of the determination made in operation S20, the $2^{nd}$ cell is placed next to the $1^{st}$ cell in the cell layout to form the cell architecture, and the connector of the $2^{nd}$ cell is merged with the one-fin bottom S/D region of the $1^{st}$ cell, or the $1^{st}$ cell is replaced with a $3^{rd}$ cell which is configured to perform a same logic function or operation of the $1^{st}$ cell, and includes an at least two-fin bottom S/D region, as an at least two-fin connector, which connects corresponding at least one NMOS to a power rail of the $3^{rd}$ cell, and is formed around at least two fins of the $3^{rd}$ cell (S30).

Figure 3:
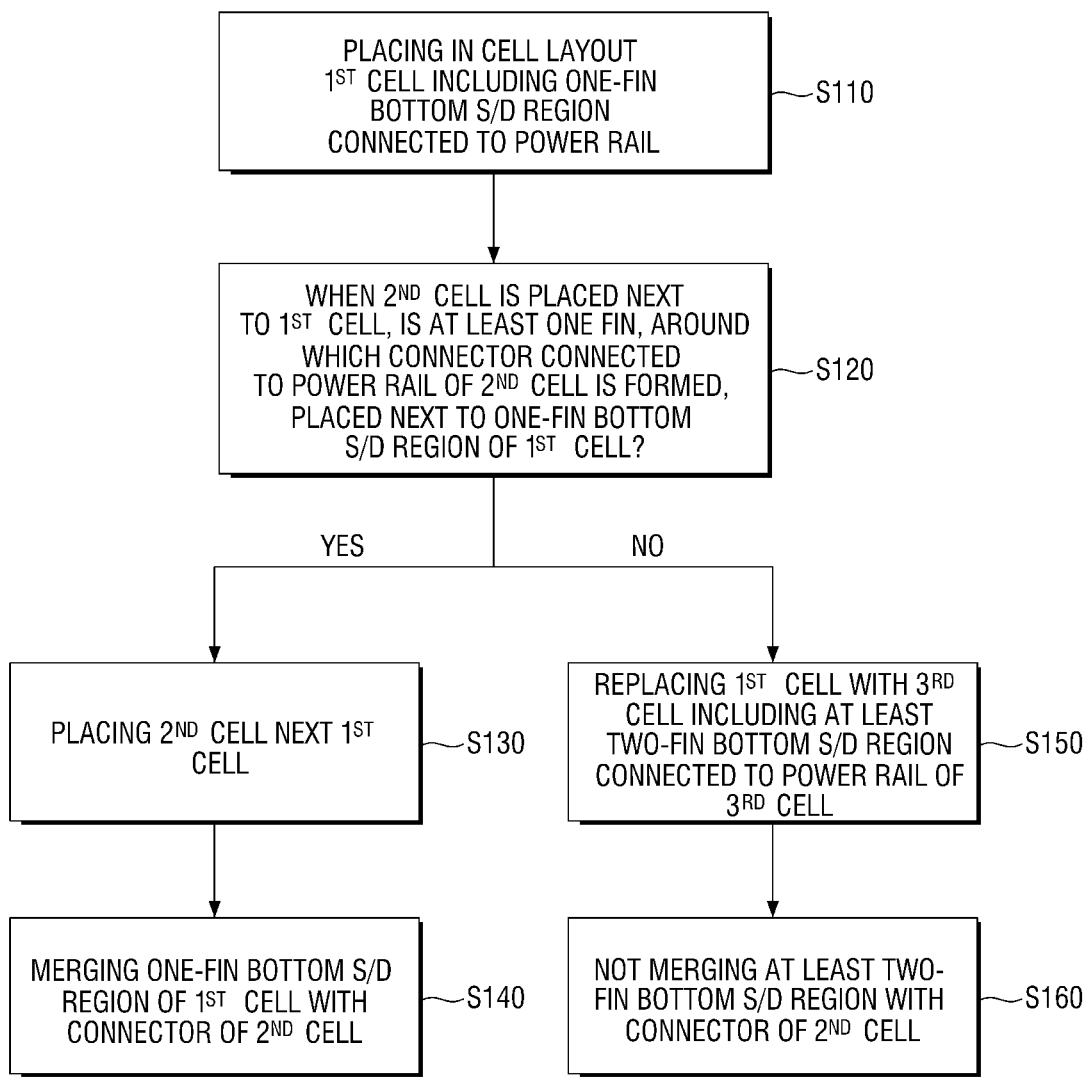
FIG. 3 illustrates a flowchart describing a detailed method for placing a plurality of cells in a cell layout to form a cell architecture, according to an embodiment.

FIG. 3 illustrates a flowchart describing a detailed method for placing a plurality of cells in a cell layout to form a desired cell architecture, according to an embodiment. This method begins with a same operation of the previous embodiment, that is, placing in the cell layout a $1^{st}$ cell including one-fin bottom S/D region which connects a corresponding NMOS, around which the one-fin bottom S/D region is formed, to a power rail of the $1^{st}$ cell, and is formed around one fin among a plurality of fins included in the $1^{st}$ cell (S110).

Next, it is determined whether, when a $2^{nd}$ cell to be placed next to the $1^{st}$ cell is placed next to the $1^{st}$ cell, at least one fin, around which a connector connected to a power rail of the $2^{nd}$ cell is formed, is placed next to the one fin of the $1^{st}$ cell so that the one-fin bottom S/D region of the $1^{st}$ cell can be merged with the connector of the $2^{nd}$ cell (S120).

Based on a result of the determination at operation S120 being positive, the $2^{nd}$ cell is placed next to the $1^{st}$ cell to form the cell architecture (S130), and further, the one-fin bottom S/D region of the $1^{st}$ cell and the connector of the $2^{nd}$ cell are merged (S140) so that the merged bottom S/D region, that is, the one-fin bottom S/D region of the $1^{st}$ cell merged with the connector of the $2^{nd}$ cell, can be easily patterned during manufacturing of the cell architecture.

However, based on a result of the determination at operation S120 being negative, the $1^{st}$ cell is replaced with the $3^{rd}$ cell which is configured to perform a same logic function or operation of the $1^{st}$ cell, and includes an at least two-fin bottom S/D region which connects corresponding at least one NMOS to a power rail of the $3^{rd}$ cell, and is formed around at least two fins of the $3^{rd}$ cell (S150). At this time, this at least two-fin bottom S/D region in the $3^{rd}$ cell is not merged with the connector of the $2^{nd}$ cell (S160) because the at least two-fin bottom S/D region of the $3^{rd}$ cell has a sufficiently wide width for easy patterning during manufacturing of the cell architecture. Here, the at least two-fin bottom S/D region of the $3^{rd}$ cell may have been formed by connecting or merging at least two bottom S/D regions of the at least one NMOS formed around the at least two fins, respectively, in the $3^{rd}$ cell. According to an embodiment, the $3^{rd}$ cell replacing the $1^{st}$ cell (S150) may also be a NAND3 cell configured to perform the same logic function or operation as that of the $1^{st}$ cell.

According to an embodiment, the $2^{nd}$ cell may include either a VFET cell including at least one fin around which at least one-fin bottom S/D region is formed to connect at least one NMOS, formed on the at least one fin, to a power rail of the VFET cell, or a fill cell including the only fin of the fill cell around which a connector is formed to be connected to a power rail of the fill cell. According to an embodiment, the only fin of the fill cell may be referred to as a dummy fin, which is the only fin in the fill cell.

When the $2^{nd}$ cell comprises the VFET cell as described above, the replacing operation (S150) and the following non-merging operation (S160) are performed based on a result of the determination made at operation S120 being negative. That is, the determination is that, when the VFET cell is placed next to the $1^{st}$ cell, the at least one fin of the VFET cell, around which the at least one bottom S/D region connecting the at least one NMOS to the power rail of the VFET cell is formed, is not positioned next to the one fin of the $1^{st}$ cell to form the cell architecture.

Meanwhile, when the $2^{nd}$ cell is the VFET cell as described above, the placing operation (S130) and the merging operation (S140) are performed based on a result of the determination made at operation S120 being positive. Here, the determination is that, when the VFET cell is placed next to the $1^{st}$ cell, the at least one fin of the VFET cell, around which the at least one bottom S/D region connecting the at least one NMOS to the power rail of the VFET cell is formed, is positioned next to the one fin of the $1^{st}$ cell to form the cell architecture, as shown in FIG. 4 described below.

Figure 4:
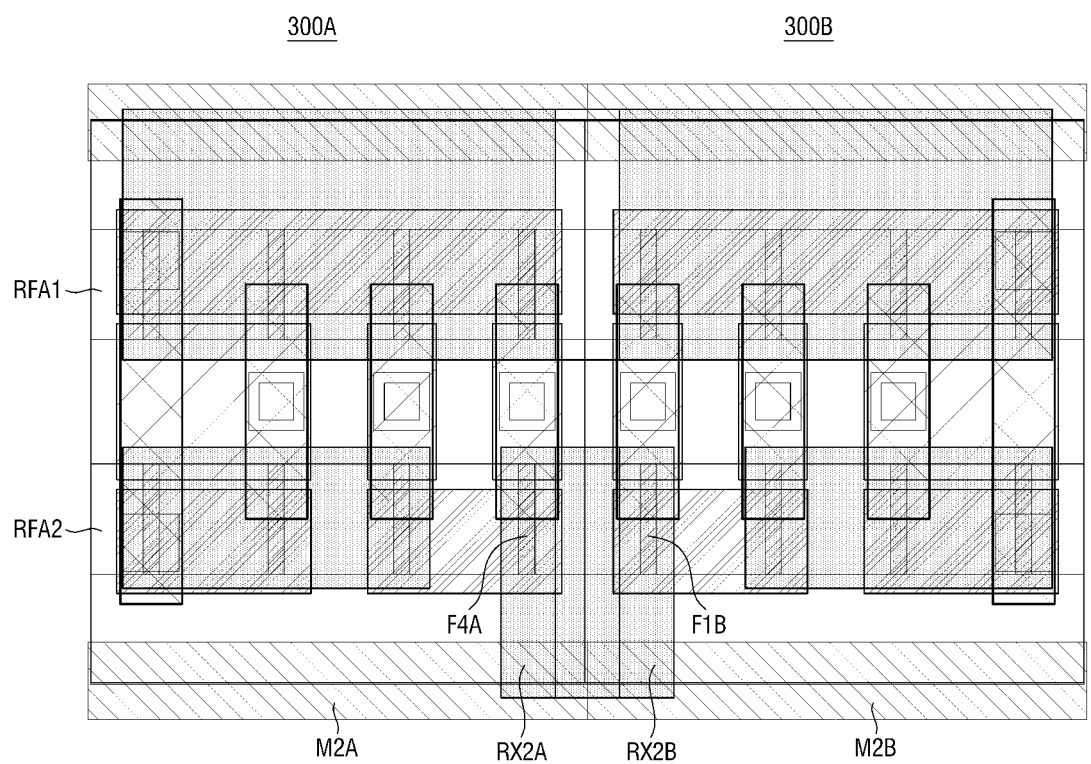
FIG. 4 illustrates a top plan view of a cell layout in which one-fin NAND3 cells are placed next to each other to form a cell architecture, according to an embodiment.

FIG. 4 illustrates a top plan view of a cell layout in which one-fin NAND3 cells are placed next to each other to form a cell architecture, according to an embodiment.

Referring to FIG. 4, a NAND3 cell 300A and a NAND3 cell 300B, both being one-fin NAND3 cells, are placed next to each other in the cell layout. The NAND3 cell 300B may have the same structure as that of the NAND3 cell 300 shown in FIG. 1D, and thus, duplicate descriptions are omitted hereafter. However, the NAND3 cell 300A is different from the NAND3 cell 300B with respect to a location of a one-fin bottom S/D region connected to a power rail as described below.

In the cell layout shown in FIG. 4, a one-fin bottom S/D region RX2A of the NAND3 cell 300A formed around a right-most fin F4A and connected to a power rail M2A is merged with a bottom S/D region RX2B of the NAND3 cell 300B formed around a left-most fin F1B and connected to a power rail M2B. Thus, the merged one-fin bottom S/D regions RX2A and RX2B can be easily patterned, as shown in FIG. 4, during manufacturing the cell architecture. Here, the power rail M2B may also be connected to the power rail M2A as shown in FIG. 4. However, the two power rails M2A and M2B may not be connected to each other, according to an embodiment.

As shown in FIG. 4, the NAND3 cells 300A and 300B are the same logic cells configured to perform the same logic function or operation. However, at the place of the NAND3 cell 300A, a different logic cell configured to perform a different logic function or operation may be placed in the cell layout to enable a wider bottom S/D region connected to the power rail M2A or M2B. For example, a two-fin inverter cell including a two-fin bottom S/D region connected to a power rail of the two-fin inverter cell may be placed next to the NAND3 cell 300B, as shown in FIG. 5 described below.

Figure 5:
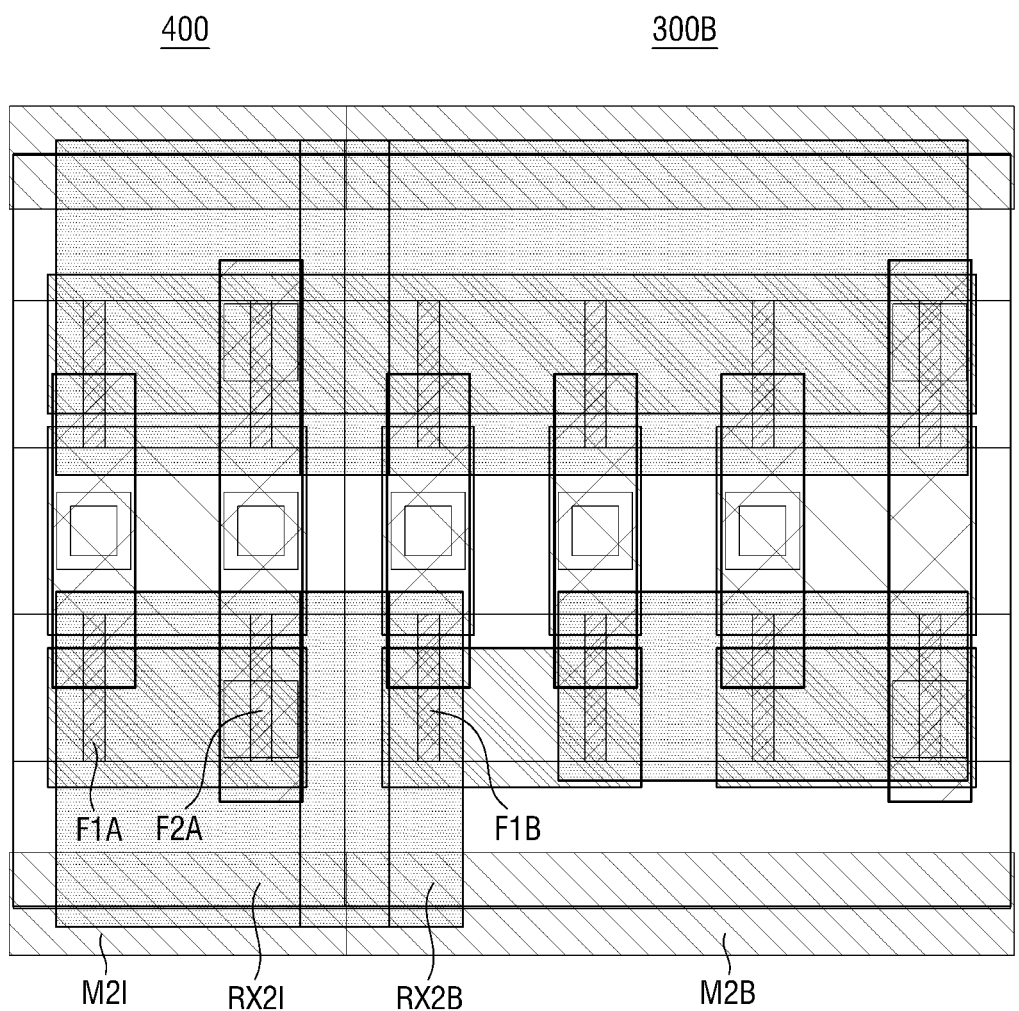
FIG. 5 illustrates a top plan view of a cell layout in which a one-fin NAND3 cell and a two-fin inverter cell are placed next to each other to form a cell architecture, according to an embodiment.

FIG. 5 illustrates a top plan view of a cell layout in which a one-fin NAND3 cell and a two-fin inverter cell are placed next to each other to form a cell architecture, according to an embodiment.

Referring to FIG. 5, a NAND3 cell 300B and a two-fin inverter cell 400 are placed next to each other in the cell layout, according to an embodiment. The NAND3 cell 300B shown in FIG. 5 may be a one-fin NAND3 cell having the same structure as that of the NAND3 cell 300 and 300B of FIGS. 1D and 4, respectively, and thus, duplicate descriptions are omitted hereafter.

In the cell layout shown in FIG. 5, a one-fin bottom S/D region RX2B of the NAND3 cell 300B formed around a left-most fin F1B and connected to a power rail M2B is merged with a two-fin bottom S/D region RX2I of the two-fin inverter cell 400 formed around two fins F1A and F2B and connected to a power rail M2I. Thus, the merged one-fin bottom S/D region RX2B and two-fin bottom S/D region RX2I can be easily patterned, as shown in FIG. 5, during manufacturing the cell architecture. Here, the power rail M2B may also be connected to the power rail M2I as shown in FIG. 5. However, the two power rails M2B and M2I may not be connected to each other, according to an embodiment.

Figure 6:
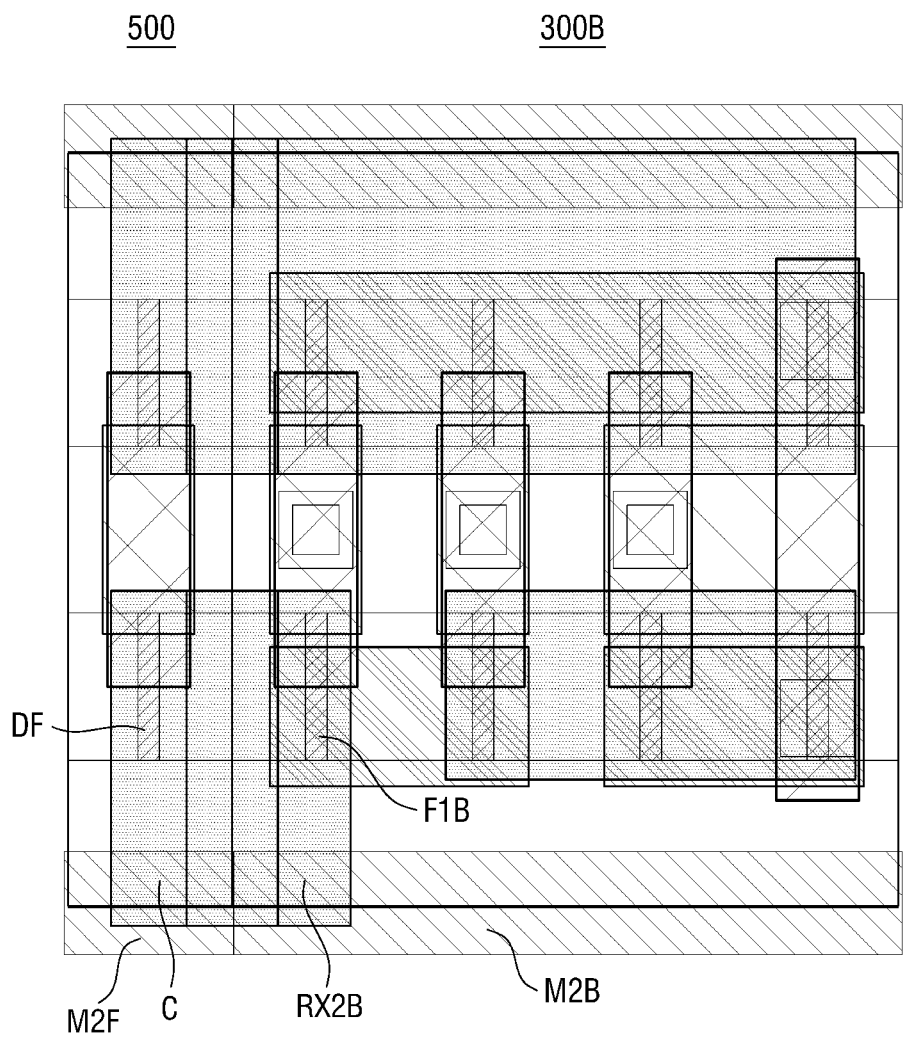
FIG. 6 illustrates a top plan view of a cell layout in which a one-fin NAND3 cell and a fill cell are placed next to each other to form a cell architecture, according to an embodiment.

Meanwhile, when the $2^{nd}$ cell is the fill cell as described above in the FIG. 3 embodiment, the placing operation (S130) and the merging operation (S140) may be performed based on determining that the fill cell includes a connector connected to the power rail of the fill cell and formed around the only fin of the fill cell which may be a dummy fin, and the fill cell can be placed next to the one fin of the $1^{st}$ cell in the cell layout as shown in FIG. 6 to form a cell architecture.

FIG. 6 illustrates a top view of a cell layout in which a one-fin NAND3 cell and a fill cell are placed next to each other to form a cell architecture, according to an embodiment.

Referring to FIG. 6, a NAND3 cell 300B and a fill cell 500 are placed next to each other in the cell layout. The NAND3 cell 300B may be a one-fin NAND3 cell having the same structure as that of the NAND3 cells 100 and 300Bs shown in FIGS. 1D, 4 and 5, respectively, and thus, duplicate descriptions are omitted hereafter.

In the cell layout shown in FIG. 6, a one-fin bottom S/D region RX2B of the NAND3 cell 300B formed around a left-most fin F1B and connected to a power rail M2B is merged with a connector C of the fill cell 500 formed around a single dummy fin DF and connected to a power rail M2F. Thus, the merged one-fin bottom S/D region RX2B and connector C can be easily patterned, as shown in FIG. 6, during manufacturing the cell architecture. According to an embodiment, the connector C of the fill cell 500 may be a bottom S/D region of a dummy NMOS formed on the dummy fin DF, according to an embodiment. Here, the power rail M2B may also be connected to the power rail M2F as shown in FIG. 6. However, the two power rails M2B and M2F may not be connected to each other, according to an embodiment.

Referring back to FIG. 3, based on a result of the determination at operation S120 being negative, that is, if it is determined that when the $2^{nd}$ cell, to be placed next to the $1^{st}$ cell, is placed next to the $1^{st}$ cell, the at least one fin, around which the connector connected to the power rail of the $2^{nd}$ cell is formed, is not placed next to the one fin of the $1^{st}$ cell, the $1^{st}$ cell is replaced with the $3^{rd}$ cell which is configured to perform the same logic function or operation as that of the $1^{st}$ cell, and includes the at least two-fin bottom S/D region connected to the power rail of the $3^{rd}$ cell and formed around the at least two fins (S150). However, the operation S150 may be replaced with different operations according to an embodiment referring to FIG. 7.

Figure 7:
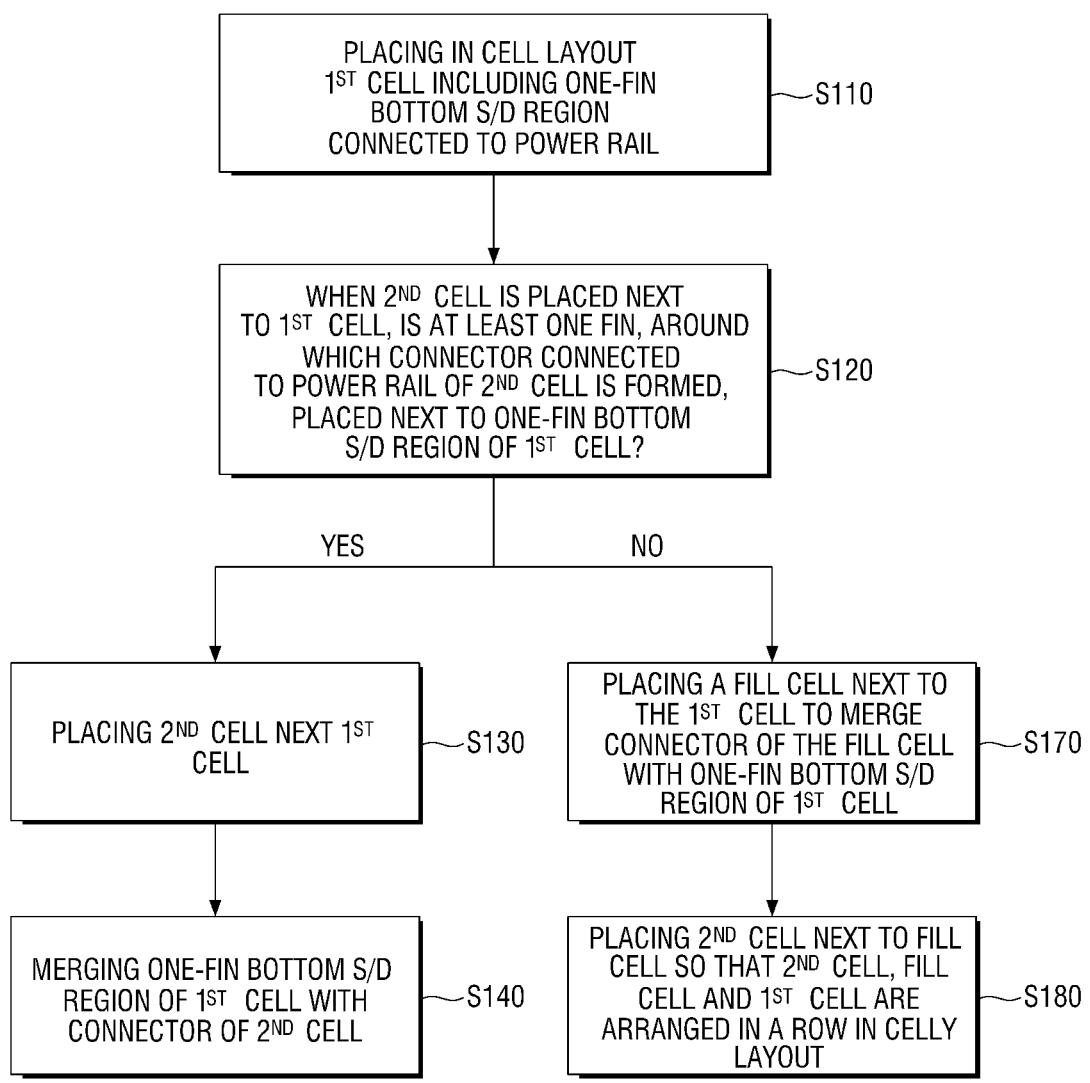
FIG. 7 illustrates a flowchart describing another method for placing a plurality of cells in a cell layout to form a cell architecture, according to an embodiment.

FIG. 7 illustrates a flowchart describing another method for placing a plurality of cells in a cell layout to form a desired cell architecture, according to an embodiment.

In the method according the present embodiment, operations S110, S120, S130 and S140 shown in FIG. 3 are repeated, and thus, descriptions thereof are omitted herein for brevity. However, operations S150 and S160 are replaced with different operations which include an operation of placing next to the $1^{st}$ cell a fill cell such as the fill cell 500 in FIG. 6 to merge a connector of the fill cell with the one-fin bottom S/D region of the $1^{st}$ cell (S170), and subsequently, placing next to the fill cell the $2^{nd}$ cell which, when placed to the $1^{st}$ cell, the at least one fin around which the connector connected to the power rail of the $2^{nd}$ cell is not placed next to the one-fin bottom S/D region of the $1^{st}$ cell, is placed next to the fill cell so that the $2^{nd}$ cell, the fill cell, and the $1^{st}$ cell are arranged in a row in the cell layout to form the cell architecture (S180), as shown in FIG. 9 to be described later.

Figure 8:
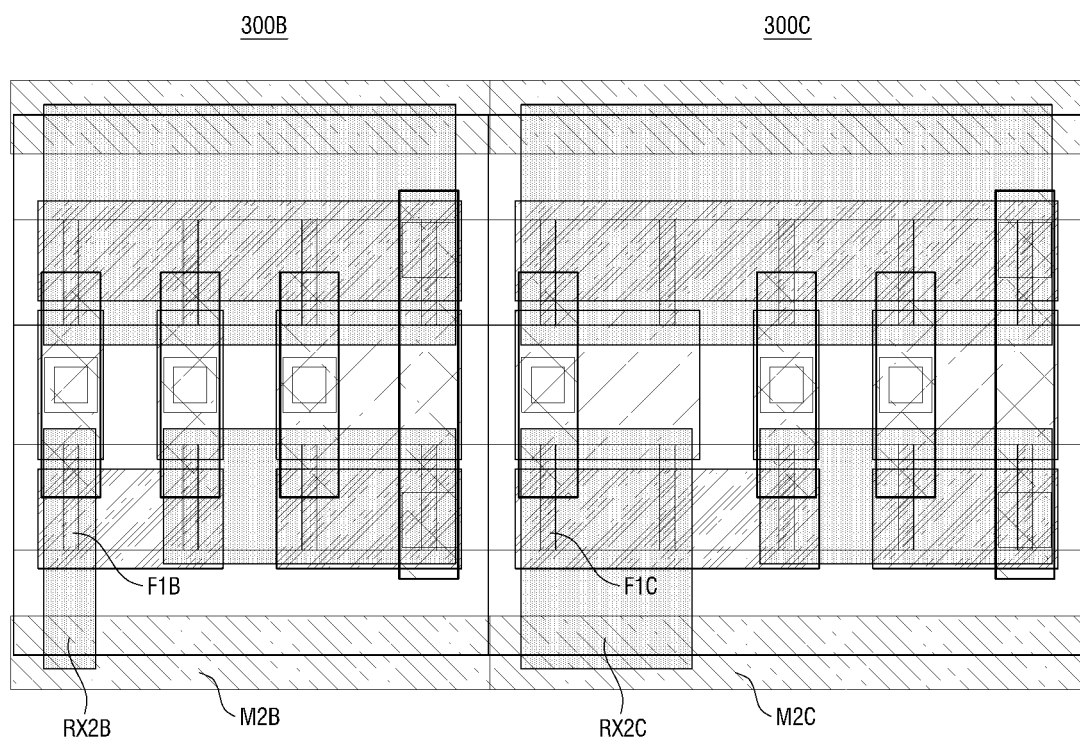
FIG. 8 illustrates a top plan view of a cell layout in which a one-fin NAND3 cell and a two-fin NAND3 cell are placed next to each other in a cell layout to form a cell architecture, according to an embodiment.

FIG. 8 illustrates a top plan view of a cell layout in which a one-fin NAND3 cell and a two-fin NAND3 cell are placed next to each other in a cell layout to form a cell architecture, according to an embodiment.

Referring to FIG. 8, a one-fin NAND3 cell 300B and a two-fin NAND3 cell 300C are placed next to each other in the cell layout. This cell layout is generated according to operation S30 and S150 described above. When the NAND3 cell 300B shown in FIGS. 4-6 is first placed in the cell layout (S10 and S110), and then, another NAND3 cell 300B is placed next to the first NAND3 cell 300B on a left side of the first NAND3 cell 300B, it is determined that the two one-fin bottom S/D regions RX2Bs of the two NAND3 cells 300Bs cannot be merged (S20 and S120). Thus, the first NAND3 cell 300B is replaced with the NAND3 cell 300C, which is a two-fin cell (S30 and S150). The NAND3 cell 300C replacing the first NAND3 cell 300B includes a two-fin bottom S/D region RX2C formed around two fins and connected to a power rail M2C. This two-fin bottom S/D region RX2C is not merged with the one-fin bottom S/D region RX2B (S160).

Figure 9:
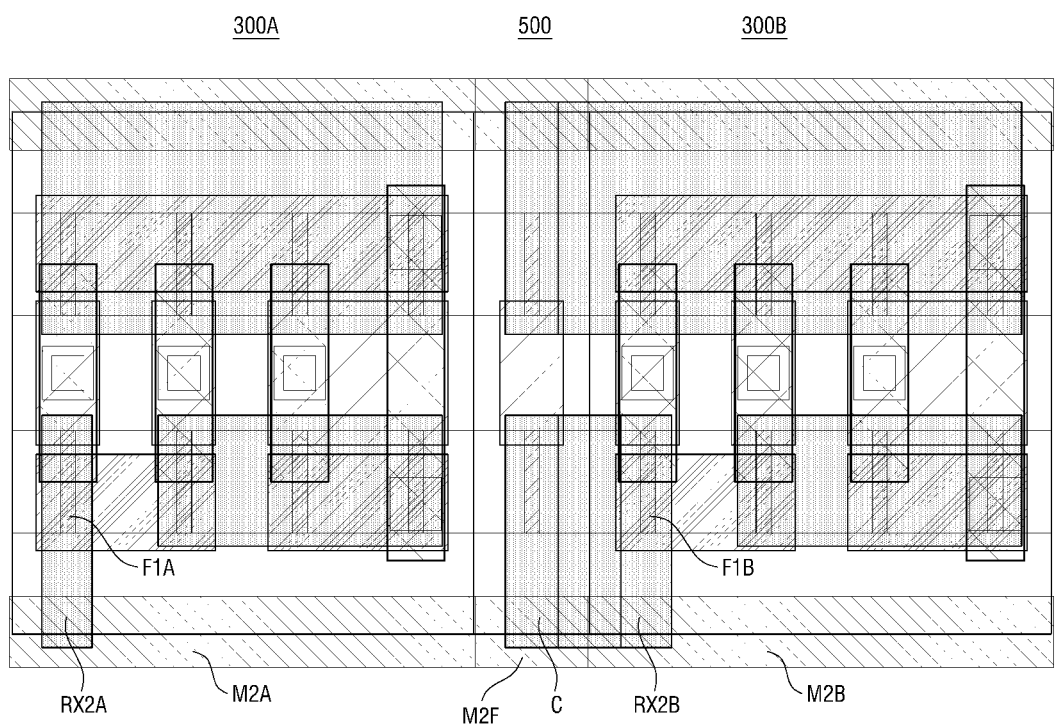
FIG. 9 illustrates a top plan view of a cell layout in which a one-fin NAND3 cell, a fill cell 500, and another one-fin NAND3 cell are placed in a row in the cell layout to form a cell architecture, according to an embodiment.

FIG. 9 illustrates a top view of a cell layout in which a one-fin NAND3 cell, a fill cell 500, and another one-fin NAND3 cell are placed in a row in a cell layout to form a cell architecture, according to an embodiment.

Referring to FIG. 9, a NAND3 cell 300A, a fill cell 500, and a NAND3 cell 300B are placed in a row in the cell layout. The NAND3 cells 300A and 300B shown in FIG. 9 may be a one-fin NAND3 cell having the same structure as the structures of the NAND3 cells 300 and 300Bs shown in FIGS. 1D and 4-6, and the fill cell 500 shown in FIG. 9 may have the same structure as that of the fill cell shown in FIG. 6, and thus, duplicate descriptions are omitted hereafter.

In the cell layout shown in FIG. 9, the fill cell 500 is placed next to the NAND3 cell 300B to merge a connector C of the fill cell 500 with a one-fin bottom S/D region RX2B of the NAND3 cell 300B formed around a left-most fin F1B and connected to a power rail M2B. The cell layout also shows that the NAND3 cell 300A is placed next to the fill cell 500 without merging a bottom S/D region RX2A, formed around a left-most fin F1A and connected to a power rail M2A, with the connector C of the fill cell 500 or the one-fin bottom S/D region RX2B of the NAND3 cell 300B. By using the fill cell 500, the cell layout shown in FIG. 9 may keep the NAND3 cell 300B to form the cell architecture without replacing the NAND3 cell 300B by another cell like the NAND3 cell 300C in FIG. 8.

According to the above embodiments, a one-fin bottom S/D region, which is difficult to pattern, may be avoided in a cell layout for designing a desired cell architecture including a one-fin cell.

Referring back to FIG. 4 illustrating the cell layout in which the two NAND3 cells 300A and 300B are placed next to each other to form a cell architecture by merging the bottom S/D regions RX2A and RX2B, it is noted that the bottom S/D region RX2A of the NAND3 cell 300A should be formed around the right-most fin F4A of the NAND3 cell 300A, and the bottom S/D region RX2B of the NAND3 cell 300B should be formed around the left-most fin F1B of the NAND3 cell 300B. Further, the cell layout of FIG. 4 shows that the NAND3 cell 300A has the bottom S/D region RX2A connected to the power rail M2A, which is a ground rail, and formed at a lower portion of the right-most fin included in the real fin area RFA2, and the NAND3 cell 300B has the bottom S/D region RX2B connected to the power rail M2B, which is also a ground rail, and formed at a lower portion of the left-most fin F1B included in the real fin area RFA2. Thus, according to an embodiment, a cell placement method may include an operation or step of determining a position of a connector connected to a power rail of a cell, such as a bottom S/D region connected to a power rail, at four corners of the cell which correspond to areas of a left-most fin in a real fin area RFA1, a left-most fin in a real fin area RFA2, a right-most fin in the real fin area RFA1, and a right-most fin in the real fin area RFA2. The aforementioned consideration may also apply to designing a cell architecture including more than two logic cells.

Figure 10:
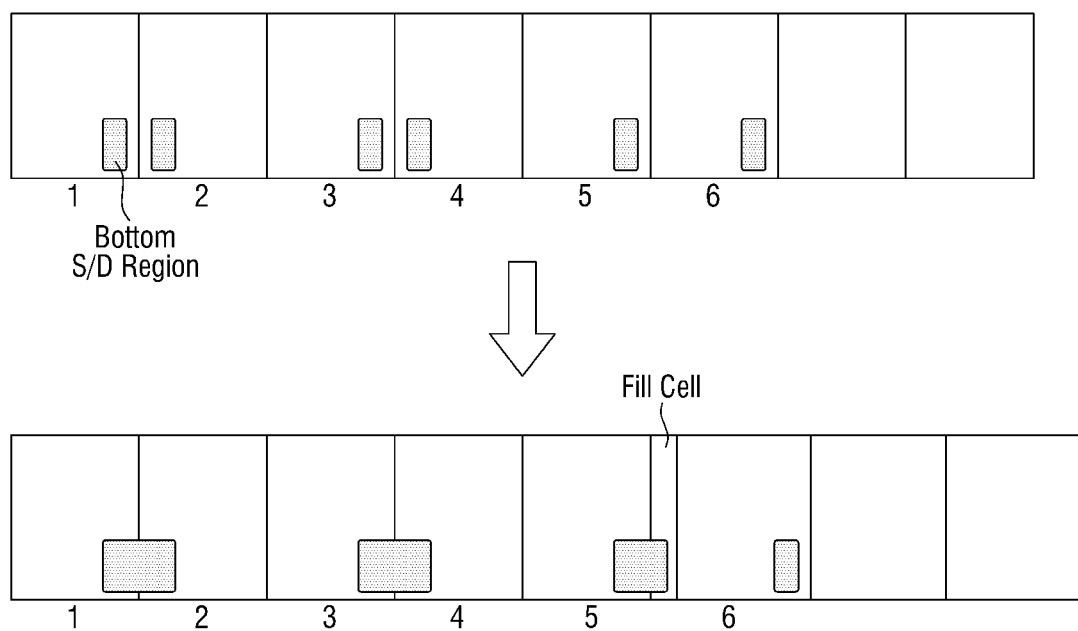
FIG. 10 illustrates a method of placing a plurality of VFET cells in a cell layout to form a cell architecture considering a position of a bottom S/D region connected to a power rail in each of the cells, according to an embodiment.

FIG. 10 illustrates a method of placing a plurality of VFET cells in a cell layout to form a cell architecture considering a position of a bottom S/D region connected to a power rail in each of the cells, according to an embodiment.

Referring to FIG. 10, cells 1, 3 and 5 having a bottom S/D region connected to a power rail of a corresponding cell and formed around a right-most fin are placed at odd positions, that is, a $1^{st}$ position, a $3^{rd}$ position, and a $5^{th}$ position in a cell width direction in a cell layout, and cells 2 and 4 having a bottom S/D region formed to a power rail of a corresponding cell and formed around a left-most fin are placed at even positions, that is, a $2^{nd}$ position and a $4^{th}$ position in the cell width direction in the cell layout. Subsequently, the bottoms S/D regions of the cells 1 and 2 are merged, and the bottom S/D regions of the cells 3 and 4 are merged.

FIG. 10 further illustrates that a cell 6 to be placed next to the cell 5 has a bottom S/D region connected to a power rail of the cell 6 only on the right-most fin of the cell 6. In this case, a fill cell having a connector connected to a power rail of the fill cell may be placed between the cell 5 and the cell 6 so that the connector of the fill cell can be merged with the bottom S/D region of the cell 5. Here, the fill cell may have the same structure discussed in reference to FIGS. 6 and 9.

In the present embodiment described in reference to FIG. 10, each bottom S/D region of the cells 1 to 6 is a one-fin bottom S/D region. However, the inventive concept is not limited thereto, and instead, one of the two merged bottom S/D regions may be an at least two-fin bottom S/D region formed around two or more fins of a corresponding cell and connected to a power rail of the corresponding cell.

The foregoing embodiments provide various methods for cell placement in a cell layout to form a cell architecture in which placement of one-fin bottom S/D region, as a connector, connected to a power rail of a cell is avoided. However, the inventive concept is not limited to the bottom S/D region, as a connection, connected to the power rail but can be extended to a top S/D contact structure formed on a top S/D region of a VFET at least because this top S/D contact structure instead of the bottom S/D region, as a connector, may be connected to the power rail of the cell. In this case, the top S/D contact structure may be connected to the power rail through a power contact structure formed below the power rail.

Figure 11A:
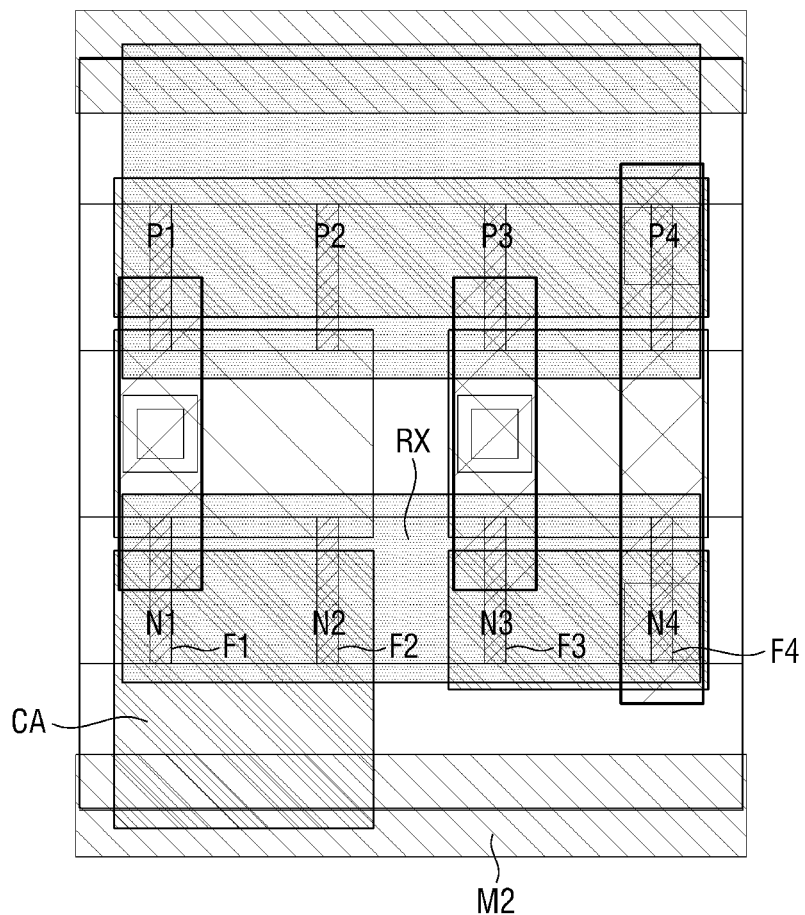
FIGS. 11A and 11B respectively illustrate top plan views of a two-fin NAND2 cell and a one-fin NAND2 cell implementing a NAND2 circuit, according to embodiments.
Figure 11B:
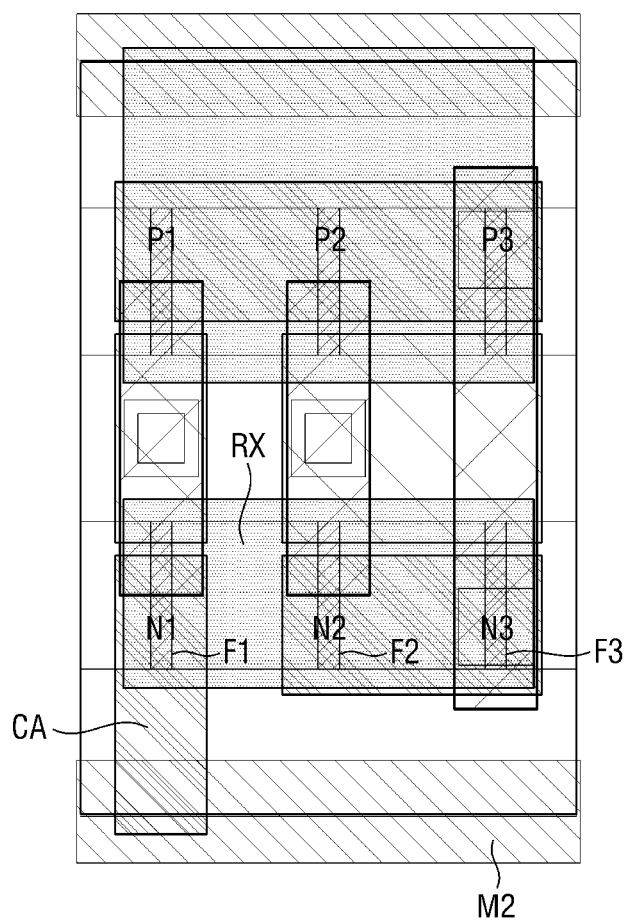
Figure 11C:
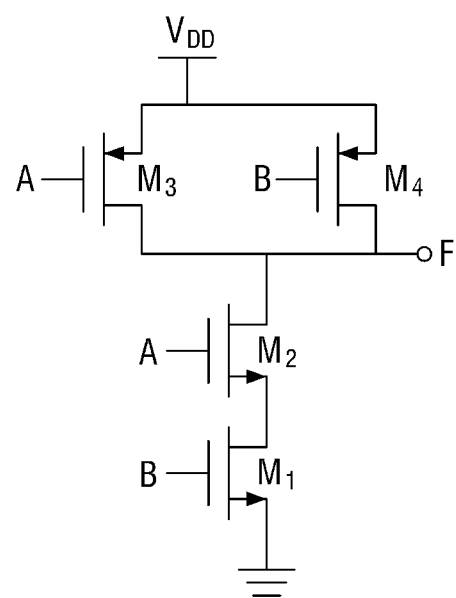
FIG. 11C illustrates a schematic of a NAND2 circuit.

FIGS. 11A and 11B respectively illustrate top plan views of a two-fin NAND2 cell and a one-fin NAND2 cell implementing a NAND2 circuit, according to embodiments. FIG. 11C illustrates a schematic of the NAND2 circuit.

Referring FIGS. 11A and 11B, a NAND2 cell 600, which is a two-fin cell, and a NAND2 cell 700, which is a one-fin cell, implementing a NAND2 circuit of FIG. 11C, are illustrated. The NAND2 cell 600 includes four PMOSs P1 to P4 and four NMOSs N1 to N4 formed around four fins F1 to F4, and the NAND2 cell 700 includes three PMOSs P1 to P3 and three NMOSs N1 to N3 formed around three fins F1 to F3. Since most of the components constituting the NAND2 cell 600 and the NAND2 cell 700 are similar to those described for the NAND3 cell 300 in FIG. 1D except the number and locations of those components, redundant descriptions are omitted herein.

However, compared to the NAND3 cell 300 in FIG. 1D, the NAND2 cell 600 is characterized in that, instead of the one-fin bottom S/D region RX2, a two-fin top S/D contact structure CA formed around the two fins F1 and F2 is connected to a power rail M2 providing a ground voltage to the NMOSs N1 and N2. Thus, the two-fin top S/D contact structure CA may be easily patterned due to a sufficient width during a manufacturing process of the NAND2 cell 600.

In contrast, the NAND2 cell 700 has a narrower one-fin top S/D contact structure CA formed around a fin F1 and connected to a power rail M2 providing a ground voltage to the NMOS N1 because the NAND2 cell is a one-fin cell. Thus, when a cell architecture including the NAND2 cell 700 is designed and manufactured, it will be very difficult to pattern the top S/D contact structure CA.

Thus, just as the one-fin bottom S/D regions RX2A and RX2B of the NAND3 cells 300A and 300B are merged as shown in FIG. 4, it may be considered two one-fin top S/D contact structures of two NAND2 cells may be merged to provide a wider top S/D contact structure when placing two NAND2 cells next to each other is required to form a desired cell architecture, as described below.

Figure 12:
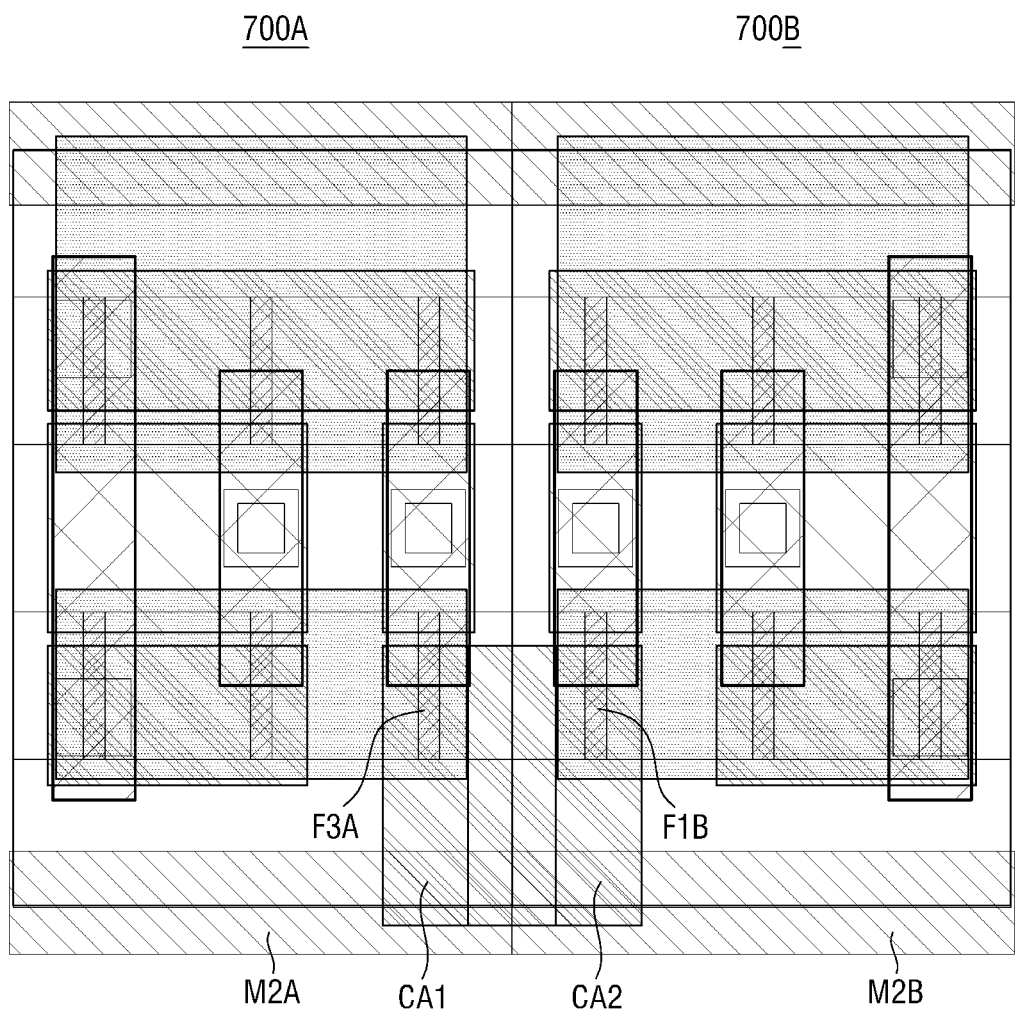
FIG. 12 illustrates a cell layout in which two one-fin NAND2 cells are placed next to each other to form a cell architecture, according to an embodiment.

FIG. 12 illustrates a cell layout in which two one-fin NAND2 cells are placed next to each other to form a cell architecture, according to an embodiment Referring to FIG. 12, a NAND2 cell 700A and a NAND2 cell 700B are placed next to each other in the cell layout. The NAND2 cell 700A has a one-fin top S/D contact structure CA1 formed around a right-most fin F3A and connected to a power rail M2A, and the NAND2 cell 300B has another one-fin top S/D contact structure CA2 formed around a left-most fin F1B and connected to a power rail M2B. Further, the two one-fin top S/D contact structures CA1 and CA2 are merged so that the merged one-fin top S/D contact structures CA1 and CA2 can be easily patterned during manufacturing the cell architecture. Here, the power rail M2B may also be connected to the power rail M2A as shown in FIG. 12. However, the two power rails M2A and M2B may not be connected to each other, according to an embodiment.

According to the above-described embodiments, it is more easily implemented to design and manufacture a higher-density cell architecture in which a one-fin cell including at least one one-fin connector connected to a power rail is placed next to another cell including an at least one-fin connector connected to a power rail of the other cell so that the two connectors are merged to provide a wider connector for easy patterning. As described above, the connector mentioned herein may include a bottom S/D region, a top S/D contact structure, or a fill cell.

In the above-described embodiments, the connectors merged with other connectors are all connected to power rails providing a ground voltage. However, the inventive concept is not limited thereto, and thus, the inventive concept may also apply when the same connectors are connected to power rails providing a power voltage opposite to the ground voltage.

The methods described in the above embodiments are provided for cell placement of the NAND3 cells and the NAND2 cells. However, the inventive concept may also apply to cell placement of different logic cells such as or-and-inverter 211 (OAI211) cell and and-or-inverter 12 (AOI21) cell, not being limited thereto, to form a desired cell architecture.

The operations or steps of the methods described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

Figure 13:
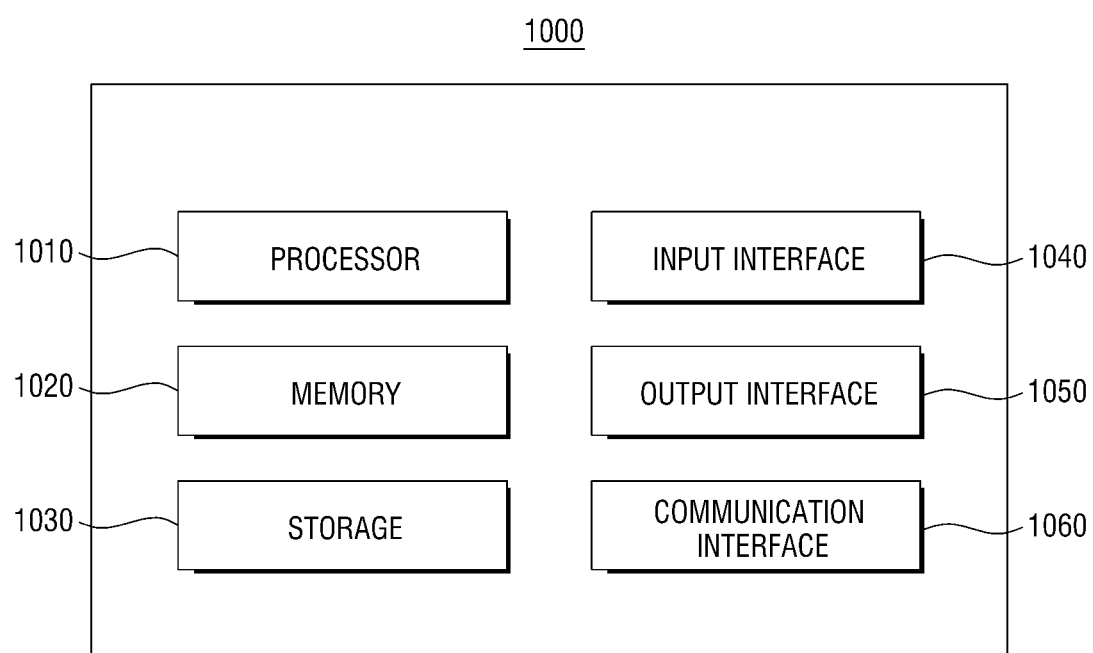
FIG. 13 illustrates a computer system configured to implement one or more of embodiments of the inventive concept, according to an embodiment.

FIG. 13 illustrates a computer system configured to implement one or more of embodiments of the inventive concept, according to an embodiment.

Referring to FIG. 13, a computer system used to implement one or more of the above-described embodiments is illustrated. The computer 100 may include at least one processor 1010 and at least one memory 1020. The processor 1010 may include at least one central processing unit (CPU) implemented by at least one microprocessor, or may be embodied as various numbers of hardware, software and/or firmware structures that execute the above the methods described in one or more of the above embodiments. The memory 1020 may include a RAM, a non-volatile memory such as ROM, flash memory, or a combination thereof. Further, the computer 1000 may include a storage 1030 which is fixed therein or removable therefrom, including, but not limited to, a magnetic storage, an optical storage, etc. The storage 1030 may store computer readable codes which embody the above methods and are loaded on the memory 1020 for execution by the processor 1010. Further, the storage 1030 may include a cell library including a plurality of cells including the cells described in the above-described embodiments. The computer 1000 may further includes an input interface 1040 such as keyboard, mouse, touch sensor, camera, microphone, etc., and an output interface 1050 such as one or more displays, speaker, printer, etc. The input interface 1040 is configured to receive a user input to control the computer 100 to execute one or more of the above methods in a wired or wireless manner. The output interface 1050 may provide a user with the plurality of cells, cell layouts and/or cell architectures described in the above embodiments in the form of display on a computer screen. The computer 1000 may also include a communication interface 1060 combined with or separate from the input interface 1040 and/or the output interface 1050 in order to receive the user input. When the above computer readable codes and/or the cell library are stored in an external storage, they may be received at the computer 100 by way of the communication interface 1060 in a wired or wireless manner.

The foregoing is illustrative of embodiments and is not to be construed as limiting thereof. Although a few embodiments have been described, those skilled in the art will readily appreciate that many modifications are possible in the above embodiments without materially departing from the inventive concept.

What is claimed is:

1. A cell architecture comprising a $1^{st}$ cell and a $2^{nd}$ cell placed next to each other in a cell width direction,
   wherein the $1^{st}$ cell comprises an at least two-fin connector which is formed around at least two fins of the $1^{st}$ cell, and connects at least one vertical field-effect transistor (VFET) of the $1^{st}$ cell to a power rail of the $1^{st}$ cell,
   wherein the $2^{nd}$ cell comprises an at least one-fin connector formed around at least one fin of the $2^{nd}$ cell to connect at least one VFET of the $2^{nd}$ cell for internal signal routing without being connected to a power rail of the $2^{nd}$ cell, and
   wherein the at least two fins of the $1^{st}$ cell and the at least one fin of the $2^{nd}$ cell are placed next to each other in the cell width direction in the cell architecture.

2. The cell architecture of claim 1, wherein the at least two-fin connector of the $1^{st}$ cell is an at least two-fin bottom S/D region of the at least one VFET of the $1^{st}$ cell, and the at least one-fin connector of the $2^{nd}$ cell is an at least one-fin bottom S/D region of the at least one VFET of the $2^{nd}$ cell.

3. The cell architecture of claim 1, wherein the at least two-fin connector of the $1^{st}$ cell is an at least two-fin top S/D contact structure formed on at least two top S/D regions of the at least one VFET of the $1^{st}$ cell, and the at least one-fin connector of the $2^{nd}$ cell is an at least one-fin top S/D contact structure formed on at least one top S/D region of the at least one VFET of the $2^{nd}$ cell.

4. A cell architecture comprising at least a $1^{st}$ cell and a $2^{nd}$ cell placed next to each other in a cell width direction,
   wherein the $1^{st}$ cell comprises a one-fin connector which is formed around a fin among a plurality of fins of the $1^{st}$ cell, and connects a vertical field-effect transistor (VFET) of the $1^{st}$ cell to a power rail of the $1^{st}$ cell,
   wherein a $2^{nd}$ cell comprises a connector connected to a power rail of the $2^{nd}$ cell,
   wherein the fin of the $1^{st}$ cell and the connector of the $2^{nd}$ cell are placed next to each other in the cell width direction in the cell architecture, and
   wherein the one-fin connector of the $1^{st}$ cell and the connector of the $2^{nd}$ cell are merged.

5. The cell architecture of claim 4, wherein the connector of the $2^{nd}$ cell is formed around one fin which is the only fin of the $2^{nd}$ cell.

6. The cell architecture of claim 4, further comprising a $3^{rd}$ cell which comprises an at least one-fin connector formed around at least one fin of the $3^{rd}$ cell for internal signal routing without being connected to a power rail of the $3^{rd}$ cell, and
wherein the $3^{rd}$ cell is placed next to the $2^{nd}$ cell such that the at least one fin of the $3^{rd}$ cell is placed next to the at least one fin of the $2^{nd}$ cell in the cell width direction in the cell architecture.

7. The cell architecture of claim 6, wherein the at least one fin of the $3^{rd}$ cell and the only fin of the $2^{nd}$ cell are not merged.

8. The cell architecture of claim 6, wherein the $3^{rd}$ cell further comprises another at least one-fin connector formed around another at least one fin of the $3^{rd}$ cell to connect at least one VFET included in the $3^{rd}$ cell to the power rail of the $3^{rd}$ cell, and
wherein the at least one fin of the $3^{rd}$ cell is placed between the other at least one fin of the $3^{rd}$ cell and the at least one fin of the $2^{nd}$ cell in the cell width direction in the cell architecture.

9. The cell architecture of claim 4, wherein the connector of the $2^{nd}$ cell comprises an at least one-fin connector which is formed around at least one fin of the $2^{nd}$ cell, and connects at least one VFET of the $2^{nd}$ cell to the power rail of the $2^{nd}$ cell.

10. The cell architecture of claim 9, wherein the one-fin connector of the $1^{st}$ cell comprises a one-fin bottom source/drain (S/D) region of the VFET of the $1^{st}$ cell, and the at least one-fin connector of the $2^{nd}$ cell comprises an at least one-fin bottom S/D region of the at least one VFET of the $2^{nd}$ cell.

11. The cell architecture of claim 9, wherein the one-fin connector of the $1^{st}$ cell comprises a one-fin top source/drain (S/D) contact structure formed on a top S/D region of the VFET of the $1^{st}$ cell, and the at least one-fin connector of the $2^{nd}$ cell comprises an at least one-fin top S/D contact structure formed on at least one top S/D region of the at least one VFET of the $2^{nd}$ cell.

12. The cell architecture of claim 9, wherein the $1^{st}$ cell and the $2^{nd}$ constitute a $1^{st}$ logic circuit and a $2^{nd}$ logic circuit, respectively, which are configured to perform a same logic function or operation.

13. The cell architecture of claim 9, wherein the $1^{st}$ cell and the $2^{nd}$ constitute a $1^{st}$ logic circuit and a $2^{nd}$ logic circuit, respectively, which are configured to perform different logic functions or operations.

14. The cell architecture of claim 9, wherein the at least one VFET of the $2^{nd}$ cell is an at least one dummy VFET configured to not receive a gate input signal.

* * * * *